United States Patent
Hsu et al.

(10) Patent No.: US 8,716,735 B2
(45) Date of Patent: May 6, 2014

(54) LIGHT-EMITTING DIODE WITH METAL STRUCTURE AND HEAT SINK

(75) Inventors: Feng-Jung Hsu, Miaoli (TW);
Chin-Chang Hsu, Pingtung (TW);
Chun-Wei Wang, New Taipei (TW);
Jian-Chin Liang, Hsinchu (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 13/415,434

(22) Filed: Mar. 8, 2012

(65) Prior Publication Data
US 2012/0228659 A1    Sep. 13, 2012

(30) Foreign Application Priority Data
Mar. 8, 2011   (TW) .............................. 100107674 A

(51) Int. Cl.
*H01L 33/00* (2010.01)
*H01L 21/00* (2006.01)

(52) U.S. Cl.
USPC .............. 257/98; 257/E33.067; 257/E33.057; 257/E33.072; 438/26; 438/28; 438/29

(58) Field of Classification Search
CPC ......... H01L 33/60; H01L 33/20; H01L 33/62; H01L 33/54; H01L 33/44
USPC ............. 257/98, E33.057–E33.058, E33.072; 438/26–29
See application file for complete search history.

(56) References Cited

U.S. PATENT DOCUMENTS

| | | | |
|---|---|---|---|
| 6,984,539 B2 | 1/2006 | Yoon | |
| 7,642,137 B2 * | 1/2010 | Lin et al. | 438/127 |
| 7,687,815 B2 | 3/2010 | Kim | |
| 2001/0030320 A1 * | 10/2001 | Budd et al. | 257/40 |
| 2003/0016539 A1 | 1/2003 | Minano et al. | |
| 2005/0274959 A1 * | 12/2005 | Kim et al. | 257/79 |
| 2006/0054915 A1 * | 3/2006 | Chang | 257/100 |
| 2006/0113544 A1 * | 6/2006 | Otsuka et al. | 257/76 |
| 2006/0214181 A1 * | 9/2006 | Lim et al. | 257/100 |
| 2006/0220036 A1 * | 10/2006 | Lee et al. | 257/81 |
| 2007/0007558 A1 | 1/2007 | Mazzochette | |

(Continued)

FOREIGN PATENT DOCUMENTS

| | | |
|---|---|---|
| TW | 200709475 | 3/2007 |
| TW | I302041 | 10/2008 |
| TW | 200926446 | 6/2009 |
| TW | 200941775 A1 | 10/2009 |

*Primary Examiner* — Ha Tran T Nguyen
*Assistant Examiner* — Thai T Vuong
(74) *Attorney, Agent, or Firm* — Muncy, Geissler, Olds & Lowe, P.C.

(57) ABSTRACT

A light-emitting diode has a metal structure, a light-emitting chip, and a bowl structure. The metal structure has a platform and a heat sink. The platform has a top face, a first side, and a second side opposite to the first side. A first reflector and a second reflector respectively extend from the first side and the second side. The heat sink extends below the top face and has a drop from the bottom surfaces of the first reflector and the second reflector. The light-emitting chip is disposed on the top face. The bowl structure covers the outer surface of the metal structure and shields the bottom surfaces of the first reflector and the second reflector. A thermal dispassion surface of the heat sink is exposed from the bowl structure. An inner surface of bowl wall has a plurality of reflection structures to promote the light extraction efficiency.

18 Claims, 12 Drawing Sheets

(56) References Cited

U.S. PATENT DOCUMENTS

| | | | |
|---|---|---|---|
| 2007/0069231 A1* | 3/2007 | Namioka | 257/99 |
| 2007/0164408 A1 | 7/2007 | Yeh et al. | |
| 2008/0019133 A1* | 1/2008 | Kim et al. | 362/294 |
| 2008/0048204 A1* | 2/2008 | Ishikura et al. | 257/99 |
| 2008/0080194 A1* | 4/2008 | Su | 362/362 |
| 2008/0296592 A1* | 12/2008 | Osamu | 257/89 |
| 2009/0045417 A1* | 2/2009 | Chao et al. | 257/89 |
| 2009/0121248 A1* | 5/2009 | Sano et al. | 257/98 |
| 2009/0140285 A1* | 6/2009 | Lin et al. | 257/100 |
| 2009/0200566 A1 | 8/2009 | Bukesov | |
| 2009/0242915 A1* | 10/2009 | Chang Chien et al. | 257/98 |
| 2009/0261368 A1* | 10/2009 | Wang et al. | 257/98 |
| 2009/0273002 A1* | 11/2009 | Chiou et al. | 257/99 |
| 2010/0163918 A1 | 7/2010 | Kim et al. | |
| 2010/0309638 A1 | 12/2010 | Chen et al. | |

* cited by examiner

LIGHT-EMITTING DIODE WITH METAL STRUCTURE AND HEAT SINK

BACKGROUND OF THE INVENTION

1. Field of the Invention

The present invention generally relates to a metal structure for a light-emitting diode. Particularly, the present invention relates to a metal structure for a light-emitting diode having thermal dissipation effect and high extraction efficiency.

2. Description of the Prior Art

Light-emitting diodes are characterized in low energy consumption, long lifetime and have been extensively employed in building decorations, indoor illumination, commercial spaces, mass transportation, automobiles, computers, and cell phones. Generally speaking, for a 5630 package (i.e. 5.6 mm in length and 3.0 mm in width), though the thermal dissipation design is employed, the light extraction efficiency and the thermal dissipation design are obviously insufficient as the customer demand increases. The main issue of the light-emitting diode manufacture process is related to the light extraction efficiency and the thermal dissipation.

As shown in FIG. 1, the traditional light-emitting diode includes a bowl 30, a resin encapsulation body 50, and a light-emitting diode chip 70. The bowl 30 is disposed with the electrode 10, wherein the electrical connection is formed between the light-emitting diode chip 70 and the electrode 10. Light in the resin encapsulation body 50 of such a light-emitting diode is total internal reflection due to the difference in refraction index between the resin encapsulation body 50 and the external medium. After several times of reflection, energy is substantially absorbed by the bowl 30, thus causing the poor extraction efficiency. If a high polymer material, such as polyphthalamide (PPA), is disposed as a reflector on the inner surface of the bowl 30, the high polymer material would be apt to blackening and lead to light attenuation.

In other traditional approaches, if a metal reflector is disposed on the electrode, the bottom of the reflector requires an additional insulating structure to isolate the electrode, which complicates the manufacturing process thereof. Besides, the light-emitting diode without any thermal dissipation design in the package process would lead to an abnormal thermal dissipation, resulting in shorter lifetime of the light-emitting diode and light attenuation.

SUMMARY OF THE INVENTION

It is one object of the present invention to provide a light-emitting diode and a metal structure thereof, which includes a heat sink protruding from a surface of a bowl structure to dissipate heat quickly and keep a lower junction temperature.

It is another object of the present invention to provide a light-emitting diode and a metal structure thereof, which includes a plurality of reflection structures on an inner surface of the cup wall or on the reflective surface of the metal structure to facilitate the light to escape from the total internal reflection and improve the light extraction inefficiency caused by the total internal reflection in the encapsulation body.

The metal structure for a light-emitting diode includes a platform and a heat sink. The platform includes a top face, a first side and a second side opposite to the first side with respect to the top face. The heat sink extends opposite to the top face from the platform and includes a thermal dissipation surface. The first reflector and the second reflector respectively extend from the first side and the second side away from the top face. The first reflector and the second reflector each has a reflective surface forming a predetermined angle with a plane where the top face lies, and the thermal dissipation surface has a drop from a bottom surface of the reflective surface of the first reflector or the second reflector.

The light-emitting diode includes a metal structure, a light-emitting chip, and a bowl structure. The light-emitting chip is disposed on the top face. The bowl structure is externally attached to the metal structure to shield the bottom surfaces of the first reflector and the second reflector and exposes the thermal dissipation surface of the heat sink. The bowl structure includes a cup wall having an inner surface connecting the reflective surfaces of the first reflector and the second reflector.

DETAILED DESCRIPTION OF THE PREFERRED EMBODIMENT

The present invention provides a light-emitting diode structure with metal reflective surface and heat sink. The light-emitting diode includes a metal structure. The metal material can be copper, copper alloy, or a layer of silver disposed on the metal reflective surface. In a preferred embodiment, the light-emitting diode may be used in illumination devices, backlight sources of LCD television or LCD panel.

Figure 1:
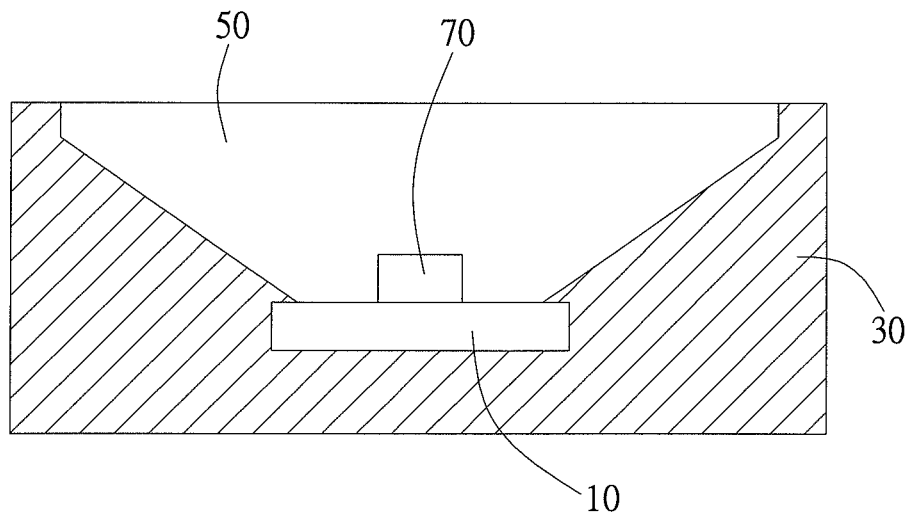
FIG. 1 is a cross-sectional view of a traditional light-emitting diode package.
Figure 2:
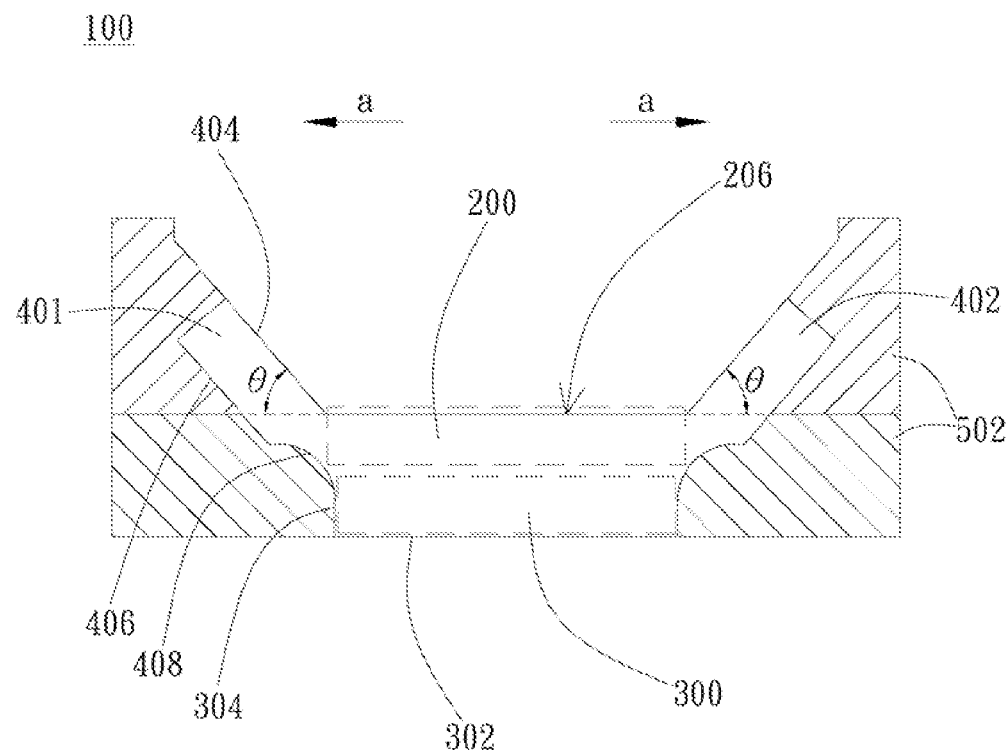
FIG. 2 is a cross-sectional view of the metal structure for the light-emitting diode of the present invention.

FIG. 2 is a cross-sectional view of the metal structure 100 and a bowl structure 502 for the light-emitting diode of the present invention. The metal structure 100 includes a platform 200 and a heat sink 300. The platform 200 includes a top face 206, a first reflector 401, and a second reflector 402. The first reflector 401 and the second reflector 402 are respectively disposed at a first side 201 and a second side 202, wherein the second side 202 is opposite to the first side 201 with respect to the top face 206. The first reflector 401 and the second reflector 402 respectively extend from the first side 201 and the second side 202 away from the top face 206 in the direction "a". The first reflector 401 and the second reflector 402 each has a reflective surface 404 forming a predetermined angle θ with a plane where the top face 206 lies. The heat sink 300 extends opposite to the top face 206 from the platform 200 and includes a thermal dissipation surface 302. The heat sink 300 is formed with a thicker structure protruding through the bowl 502 and exposed from the bottom of the bowl structure 502 to serve as the thermal dissipation surface 302, so that the heat generated from the light-emitting chip can be rapidly dissipated to extend the lifetime and maintain the light intensity of light-emitting diode.

The thermal dissipation surface 302 extends downwardly from the platform 200 and has a drop from a bottom surface 406 of the first reflector 401 or the second reflector 402. The sidewall 304 of the heat sink 300 is formed around the drop, and the root portion 408 of the sidewall 304 is formed at the boundary between the sidewall 304 and the first reflector 401 and/or the second reflector 402 near the platform 200. The bowl structure 502 is externally formed on the metal structure 100. That is, the bowl structure 502 is formed on the outer part of the metal structure 100. The bowl structure 502 exposes the thermal dissipation surface 302 of the heat sink 300 and is externally attached to the metal structure 100 to shield the sidewall 304 of the heat sink 300, the bottom surfaces 406 of the first reflector 401 and the second reflector 402 and extends upward to the top portion of a encapsulation body 500. The predetermined angle θ mentioned above may include any angle between 0 degree and 90 degrees to adjust the path of light for achieving higher light extraction efficiency.

Figure 3A:
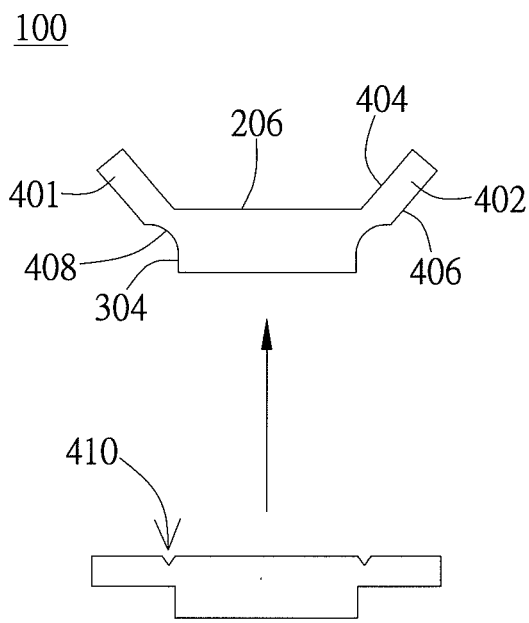
FIG. 3A to FIG. 3C are schematic views showing the forming process of the groove of the metal structure.
Figure 3B:
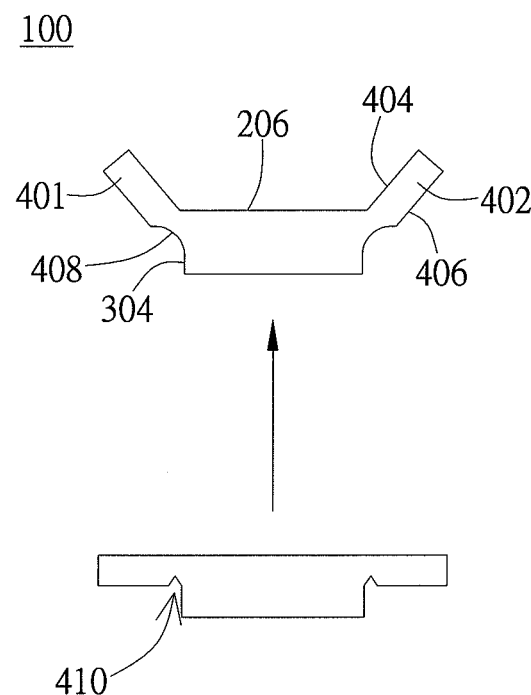
Figure 3C:
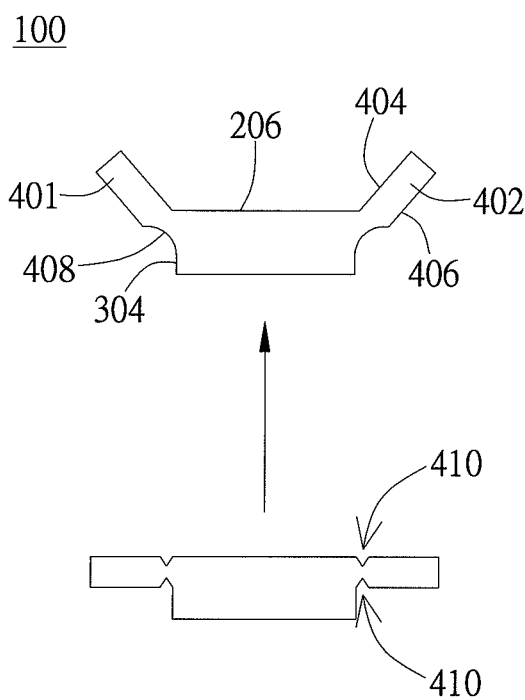

As shown in FIG. 3A to FIG. 3C, the first reflector 401 and the second reflector 402 of the metal structure 100 can be formed by different arrangements and processing of the groove 410. The grooves 410 can be formed at the boundary between the first reflector 401 and the sidewall 304 and between the second reflector 402 and the sidewall 304 along the root portion 408. In the preferred embodiment as shown in FIG. 3A, The groove 410 is made by cutting or pressing on the same side of the reflective surfaces 404 of the first reflector 401 and the second reflector 402. That is, the groove 410 is located at the boundary between the reflector 401/402 and the top face 206. The groove 410 is apt to facilitate the bending of the metal material upwardly to form the first reflector 401 and the second reflector 402. In other embodiments, the groove 410 may be formed on a side opposite to the reflective surfaces 404 of the first reflector 401 and the second reflector 402. That is, the groove 410 is disposed at the boundary between the reflector 401/402 and the heat sink 304. In addition, the grooves 410 can be formed on the upper surface and downer surface of the metal structure 100.

Figure 4:
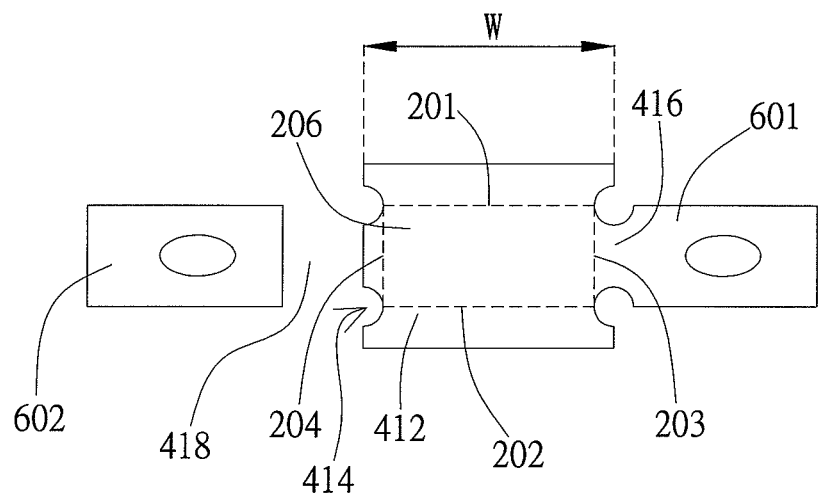
FIG. 4 is a top view of the metal structure and the electrode bases.

FIG. 4 is a top view of the metal structure and the electrode bases. As shown in FIG. 4, the first reflector 401 and the second reflector 402 are disposed on the first side 201 and the second side 202, which is opposite to the first side 201 with respect to the top face 206. Each of the first reflector 401 and the second reflector 402 has a width W. The neck structure 412 is formed at the boundary between the first reflector 401 and the top face 206 as well as the boundary between the second reflector 402 and the top face 206. The width of the neck structure 412 is smaller than the width W of the first reflector 401 or the second reflector 402. Two sides of the neck structure 412 respectively have a notch in segmented circle shape. That is, two sides of the neck structure 412 are respectively formed with a semi-open through hole 414 to serve as the positioning hole to be utilized in the positioning of the mold. Besides, the semi-open through hole 414 of the neck structure 412 also facilitates the bending of the first reflector 401 and the second reflector 402 upward.

As shown in FIG. 4, the metal structure 100 includes a first electrode base 601 outwardly extending from a third side 203 of the top face 206. The first electrode 601 is connected to the top face 206 by a neck structure 416. A second electrode base 602 is disposed corresponding to a fourth side 204 of the platform 206 and has a spacing 418 with the forth side 204. The spacing 418 is used for insulation to distinguish the positive electrode and the negative electrode. The third side 203 and the fourth side 204 are two opposite sides of the top face 206 and connected between the first side 201 and the second side 202. In other embodiments, the top face 206 can be separated along the direction parallel to the third side 203 and the fourth side 204 to allow one portion of the top face 206 to be connected to the first electrode base 601 and the other portion of the top face 206 to be connected to the second electrode base 602, wherein the spacing 418 is located between the two separated portions of the top face 206 for insulation.

Figure 5:
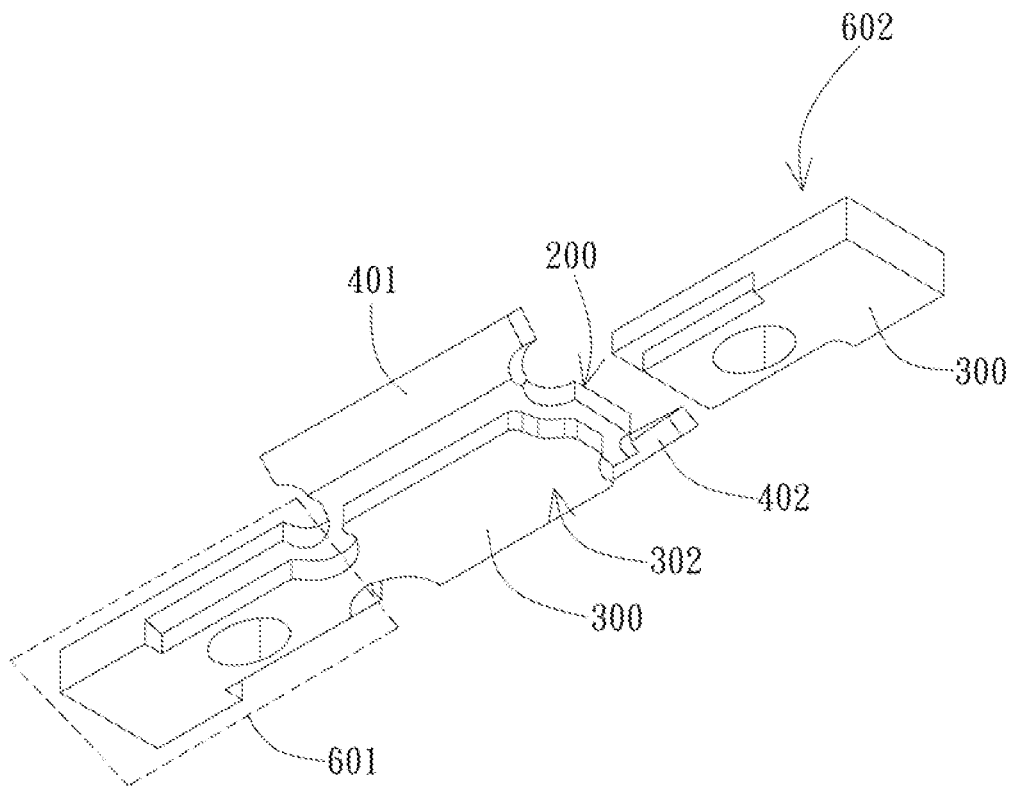
FIG. 5 is a bottom view of the metal structure and the electrode bases.

FIG. 5 is a bottom view of the metal structure and the electrode bases. As shown in FIG. 5, the metal material has different thickness, and thus the bottom portion of the metal structure 100 can be exposed as the dissipation surface 302 after the package process. The heat sink 300 is formed opposite to the platform 200 and extends to the bottom portion of the first electrode base 601. Besides, the bottom portion of the second electrode base 602 also includes the heat sink 300. In other embodiments, the heat sink 300 may extend from the bottom of the platform 200 to a portion of the first electrode base 601 as well as a portion of the second electrode base 602.

Figure 6A:
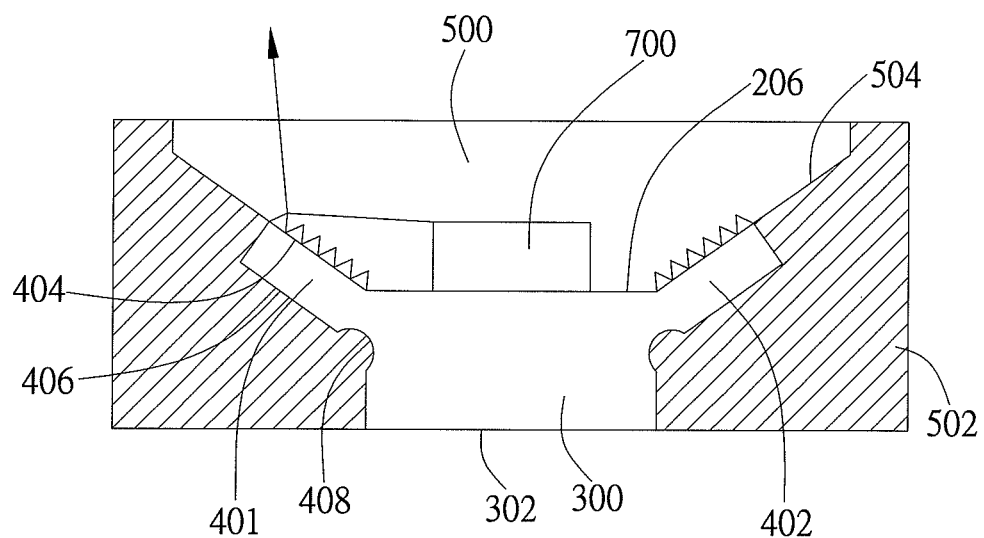
FIG. 6A is a cross-sectional view of an embodiment of the light-emitting diode having the reflection structure.
Figure 6B:
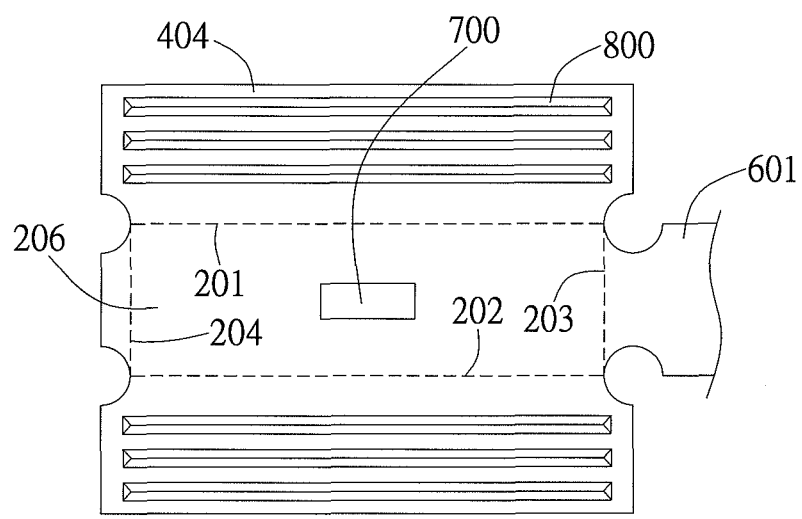
FIG. 6B is a top view of the embodiment of the light-emitting diode having the reflection structure.

FIG. 6A and FIG. 6B illustrate an embodiment of the light-emitting diode. As shown in FIG. 6A, the light-emitting diode includes the metal structure 100, the light-emitting chip 700, and the bowl structure 502. The light-emitting chip 700 is disposed on the top face 206 of the metal structure 100. The bowl structure 502 is externally attached to the metal structure 100 to shield the bottom surfaces 406 of the first reflector 401 and the second reflector 402 and expose the dissipation surface 302 of the heat sink 300. The bowl structure 502 has a cup wall, wherein the inner surface 504 of the cup wall connects the reflective surfaces 404 of the first reflector 401 and the second reflector 402 and extends along the first reflector 401 and the second reflector 402 away from the top face 206. Besides, the reflective surfaces 404 of the first reflector 401 and the second reflector 402 have a plurality of reflection structures 800 distributed regularly on the reflective surfaces 404 around the top face 206, as shown in FIG. 6B. In this embodiment, the cross section of the reflection structure 800 is a triangular prism. The reflective path of light is changed by the reflection structures 800, facilitating light emitted from the light-emitting chip 700 to escape from the path of total internal reflection and promoting the light extraction efficiency of the light-emitting diode. As such, a lower extraction efficiency caused by multiple reflections in the encapsulation body 500 can be prevented. In other embodiments, the reflection structures 800 may be a plurality of pyramid bodies, hemispheres, and other structures.

Figure 7:
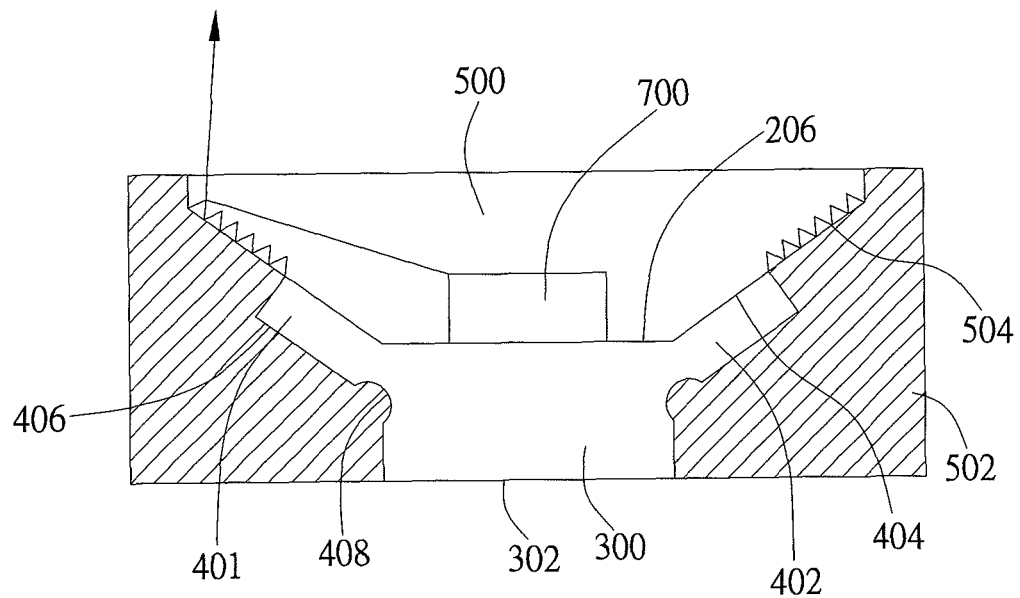
FIG. 7 is a cross-sectional view of another embodiment of the light-emitting diode having the reflection structure.

FIG. 7 is a cross-sectional view of another embodiment of the light-emitting diode having the reflection structure. As shown in FIG. 7, the plurality of reflection structures 800 is formed on the inner surface 504 of the cup wall of the light-emitting diode, wherein the reflection structures are distributed around the top face 206. In this embodiment, the cross section of the reflection structure 800 is a triangular prism. Similar to the design of FIG. 6A, the reflective path of light is changed by the reflection structures 800, which facilitates light from the light-emitting chip 700 to escape the path of total internal reflection and promotes the light extraction efficiency of the light-emitting diode. Therefore, a lower extraction efficiency caused by multiple reflections in the encapsulation body 500 can be prevented. In other embodiments, the reflection structures 800 may be a plurality of tetrahedrons, hemispheres, and other structures.

Figure 8A:
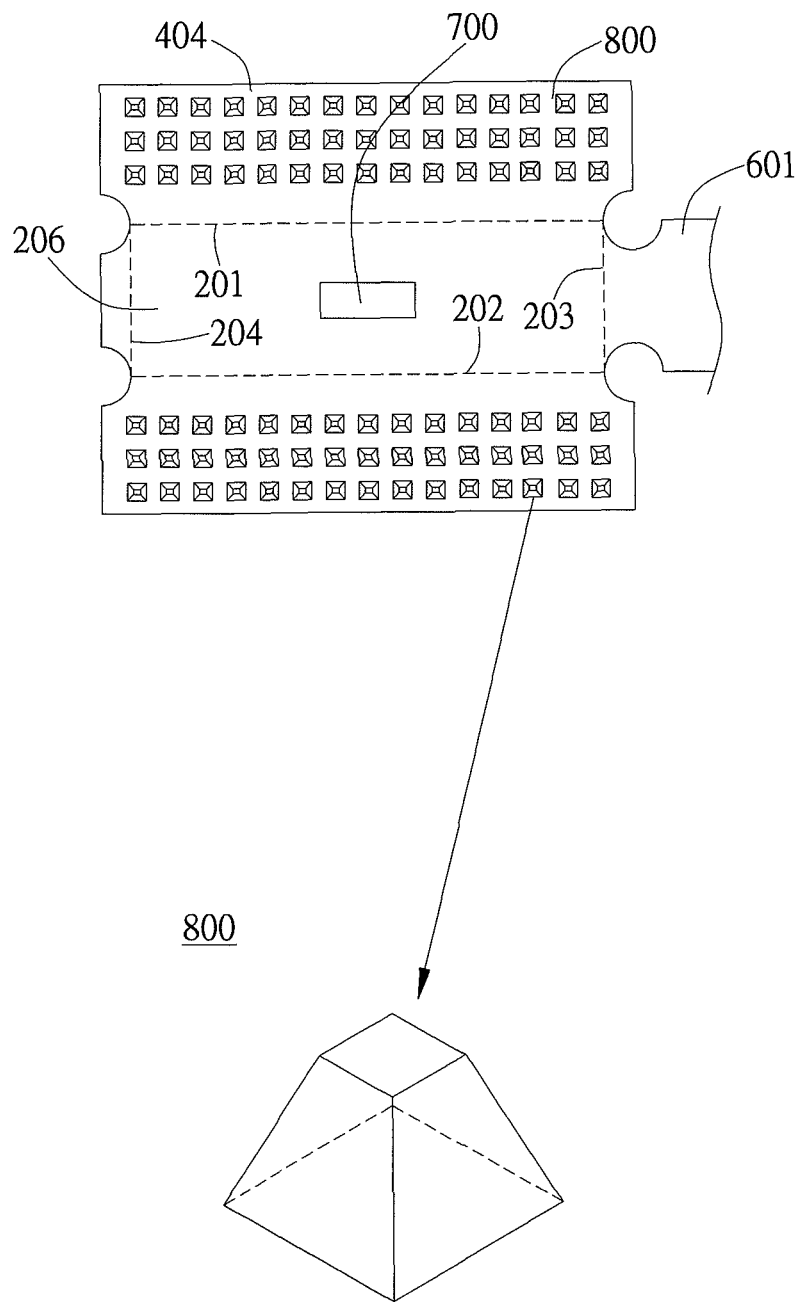
FIGS. 8A and 8B are top views of different embodiments of the reflection structure.
Figure 8B:
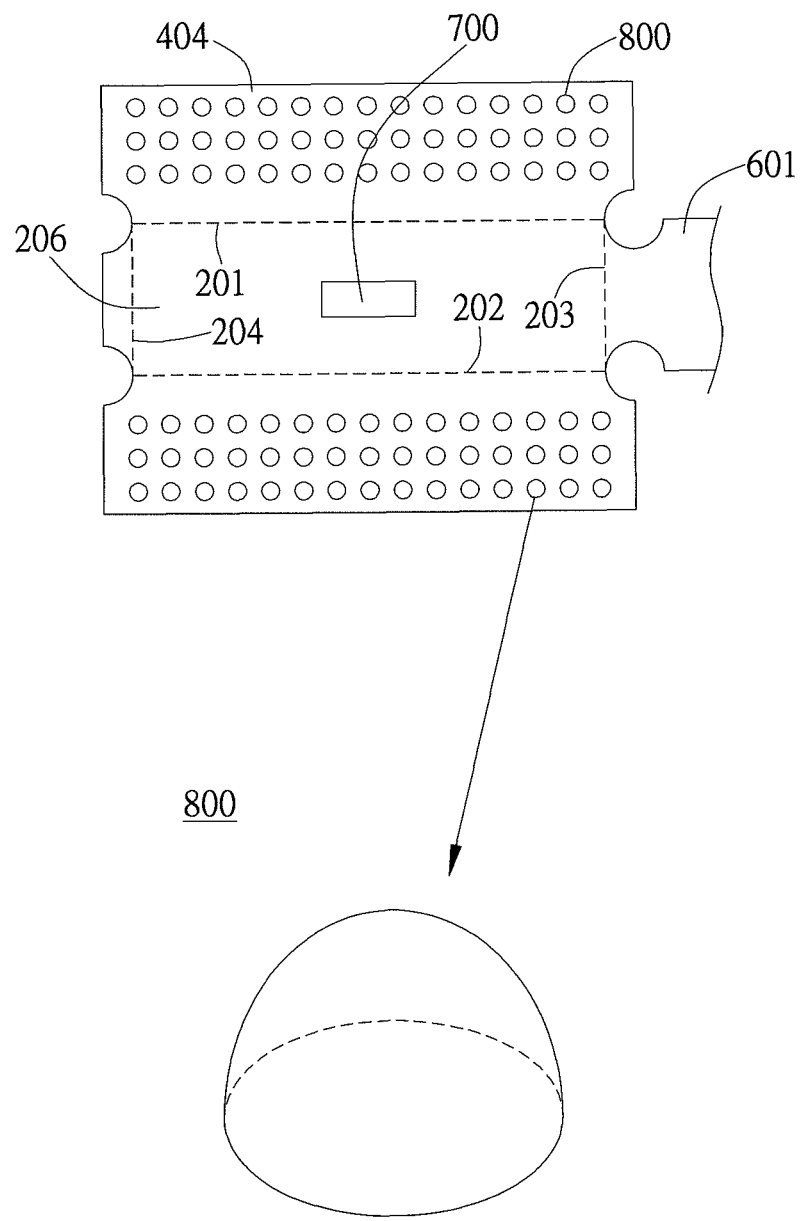

FIG. 8A is another embodiment of the reflection structures 800. In this embodiment, the cross section of the reflection structure 800 is a trapezoidal prism. The reflection structures 800 are distributed on the reflective surfaces 404. In another embodiment, the reflection structures 800 are a plurality of trapezoidal prisms and distributed regularly on the inner surface 504 of the cup wall around the top face 206. As shown in FIG. 8B, the cross section of the reflection structures 800 is a hemisphere. In another embodiment, the reflection structures 800 are a plurality of hemispheres and distributed regularly on the inner surface 504 of the cup wall around the top face 206. Besides, the reflection structures 800 can be distributed irregularly on the reflective surface 404 or the inner surface 504 of the cup wall around the top face 206.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A metal structure for a light-emitting diode, comprising:
   a platform including a top face, a first side and a second side opposite to the first side with respect to the top face;
   a heat sink extending opposite to the top face from the platform and including a thermal dissipation surface; and
   a first reflector and a second reflector respectively extending from the first side and the second side away from the top face, wherein the first reflector and the second reflector each has a reflective surface forming a predetermined angle with a plane where the top face lies, and the thermal dissipation surface has a drop from a bottom surface of the first reflector or the second reflector, and the bottom surface connects the plane where the top surface lies at a second angle which is smaller than 90 degrees,
   wherein the heat sink has a sidewall disposed on a side of the thermal dissipation surface and connected to the platform, and the first reflector connects a root portion of the sidewall near the platform;
   wherein the reflective surface and the bottom surface are parallel to each other and extend away from a sidewall of the heat sink, the bottom surface is inclined to an extending direction of the heat sink.

2. The metal structure of claim 1, wherein a groove is formed between the first reflector and the sidewall along the root portion.

3. The metal structure of claim 1, wherein a neck structure is formed between the first reflector and the top face, and the width of the neck structure is smaller than the width of the first reflector.

4. The metal structure of claim 3, wherein two sides of the neck structure are respectively formed with a semi-open through hole.

5. The metal structure of claim 1, wherein a groove is formed between the first reflector and the top face along the first side.

6. The metal structure of claim 1, further comprising:
   a first electrode base extending from a third side of the platform; and
   a second electrode base disposed corresponding to a fourth side of the platform and having a spacing with the forth side;
   wherein the third side and the fourth side are two opposite sides of the platform and connected between the first side and the second side.

7. The metal structure of claim 6, wherein at least a portion of the heat sink extends to form a bottom portion of the first electrode base and at least a portion of the heat sink is formed by extending the second electrode base opposite to the top face.

8. The metal structure of claim 1, wherein a plurality of reflection structures are disposed on the reflective surface and distributed around the top face.

9. A light-emitting diode, comprising:
   a metal structure, comprising:
   a platform including a top face, a first side and a second side opposite to the first side with respect to the top face;
   a heat sink extending opposite to the top face from the platform and including a thermal dissipation surface; and
   a first reflector and a second reflector respectively extending from the first side and the second side away from the top face, wherein the first reflector and the second reflector each has a reflective surface forming a predetermined angle with a plane where the top face lies, and the thermal dissipation surface has a drop from a bottom surface of the first reflector or the second reflector, and the bottom surface connects the plane where the top surface lies at a second angle which is smaller than 90 degrees;
   wherein the heat sink has a sidewall disposed on a side of the thermal dissipation surface and connected to the platform, and the first reflector connects a root portion of the sidewall near the platform;
   a light-emitting chip disposed on the top face; and
   a bowl structure externally attached to the metal structure to shield the bottom surfaces of the first reflector and the second reflector and expose the thermal dissipation surface of the heat sink, wherein the bowl structure includes a cup wall having an inner surface connecting the reflective surfaces of the first reflector and the second reflector;
   wherein the reflective surface and the bottom surface are parallel to each other and extend away from a sidewall of the heat sink, the bottom surface is inclined to an extending direction of the heat sink,
   wherein the first reflector and the second reflector are embedded in the cup wall, the reflective surfaces of the first reflector and the second reflector are exposed to the cup wall and aligned with the inner surface of the bowl structure.

10. The light-emitting diode of claim 9, wherein a plurality of reflection structures is disposed on the inner surface of the cup wall and distributed around the top face.

11. A metal structure for a light-emitting diode, comprising:
   a platform including a top face, a first side, a second side, a third side and a fourth side, wherein the second side is opposite to the first side with respect to the top face, and the fourth side is opposite to the third side with respect to the top face to form between the first side and the second side separately;
   a heat sink extending opposite to the top face from the platform and including a thermal dissipation surface;
   a first reflector and a second reflector respectively extending from the first side and the second side away from the top face, wherein the first reflector and the second reflector each has a reflective surface forming a predetermined angle with a plane where the top face lies, and the thermal dissipation surface has a drop from a bottom surface of the first reflector and the second reflector, and the bottom surface connects the plane where the top surface lies at a second angle which is smaller than 90 degrees;
   wherein the heat sink has a sidewall disposed on a side of the thermal dissipation surface and connected to the platform, and the first reflector connects a root portion of the sidewall near the platform, wherein the reflective surface and the bottom surface are parallel to each other and extend away from a sidewall of the heat sink, the bottom surface is inclined to an extending direction of the heat sink, a first electrode base extending from a third side of the platform; and a second electrode base disposed corresponding to a fourth side of the platform and having a spacing with the forth side.

12. The metal structure of claim 11, wherein a groove is formed between the first reflector and the sidewall along the root portion.

13. The metal structure of claim 11, wherein a neck structure is formed between the first reflector and the top face, and the width of the neck structure is smaller than the width of the first reflector.

14. The metal structure of claim 13, wherein two sides of the neck structure are respectively formed with a semi-open through hole.

15. The metal structure of claim 11, wherein a groove is formed between the first reflector and the top face along the first side.

16. The metal structure of claim 11, wherein a plurality of reflection structures are disposed on the reflective surface and distributed around the top face.

17. A light-emitting diode, comprising:
a metal structure, comprising:
a platform including a top face, a first side, a second side, a third side and a fourth side, wherein the second side is opposite to the first side with respect to the top face, and the fourth side is opposite to the third side with respect to the top face to form between the first side and the second side separately;

a heat sink extending opposite to the top face from the platform and including a thermal dissipation surface;

a first reflector and a second reflector respectively extending from the first side and the second side away from the top face, wherein the first reflector and the second reflector each has a reflective surface forming a predetermined angle with a plane where the top face lies, and the thermal dissipation surface has a drop from a bottom surface of the first reflector or the second reflector, and the bottom surface connects the plane where the top surface lies at a second angle which is smaller than 90 degrees;

wherein the heat sink has a sidewall disposed on a side of the thermal dissipation surface and connected to the platform, and the first reflector connects a root portion of the sidewall near the platform;

a first electrode base extending from a third side of the platform;

a second electrode base disposed corresponding to a fourth side of the platform and having a spacing with the forth side;

a light-emitting chip disposed on the top face; and a bowl structure externally attached to the metal structure to shield the bottom surfaces of the first reflector and the second reflector and expose the thermal dissipation surface of the heat sink, wherein the bowl structure includes a cup wall having an inner surface connecting the reflective surfaces of the first reflector and the second reflector;

wherein the reflective surface and the bottom surface are parallel to each other and extend away from a sidewall of the heat sink, the bottom surface is inclined to an extending direction of the heat sink, wherein the first reflector and the second reflector are embedded in the cup wall, the reflective surfaces of the first reflector and the second reflector are exposed to the cup wall and aligned with the inner surface of the bowl structure.

18. The light-emitting diode of claim 17, wherein a plurality of reflection structures is disposed on the inner surface of the cup wall and distributed around the top face.

\* \* \* \* \*